United States Patent
Tryon et al.

(10) Patent No.: US 8,088,260 B2
(45) Date of Patent: Jan. 3, 2012

(54) PUCK FOR CATHODIC ARC COATING WITH CONTINUOUS GROOVE TO CONTROL ARC

(75) Inventors: Brian S. Tryon, Glastonbury, CT (US); Michael C. Swift, Manchester, CT (US); Michael Dileo, Columbia, CT (US)

(73) Assignee: United Technologies Corporation, Hartford, CT (US)

( * ) Notice: Subject to any disclaimer, the term of this patent is extended or adjusted under 35 U.S.C. 154(b) by 960 days.

(21) Appl. No.: 11/838,253

(22) Filed: Aug. 14, 2007

(65) Prior Publication Data

US 2009/0045045 A1 Feb. 19, 2009

(51) Int. Cl.
*C23C 14/34* (2006.01)

(52) U.S. Cl. .................. 204/192.38; 204/298.41

(58) Field of Classification Search ............ 204/298.41, 204/192.38
See application file for complete search history.

(56) References Cited

U.S. PATENT DOCUMENTS

| | | | |
|---|---|---|---|
| 4,002,518 A | 1/1977 | Shaw | |
| 4,090,941 A | 5/1978 | Wright | |
| 5,007,373 A | 4/1991 | Legg | |
| 5,932,078 A | 8/1999 | Beers | |
| 5,972,185 A | 10/1999 | Hendricks | |
| 6,036,828 A * | 3/2000 | Beers et al. | 204/298.41 |
| 6,103,074 A | 8/2000 | Khominich | |
| 6,224,726 B1 | 5/2001 | Beers | |
| 6,608,432 B2 | 8/2003 | Weaver | |
| 6,770,178 B2 | 8/2004 | Marszal | |
| 2004/0055884 A1* | 3/2004 | Fujii et al. | 204/298.41 |

FOREIGN PATENT DOCUMENTS

| | | |
|---|---|---|
| EP | 0899773 | 3/1999 |
| EP | 1111086 | 6/2001 |

OTHER PUBLICATIONS

European Search Report dated Nov. 21, 2008.

* cited by examiner

*Primary Examiner* — Keith Hendricks
*Assistant Examiner* — Jason M Berman
(74) *Attorney, Agent, or Firm* — Carlson, Gaskey & Olds, PC

(57) ABSTRACT

A puck for providing a coating material in a cathodic arc coating system has a generally uniform depression formed at the outer periphery. The depression ensures that an arc from the coating apparatus will move uniformly about the outer periphery of the puck, such that a coating cloud will also be uniformly applied to parts to be coated.

3 Claims, 2 Drawing Sheets

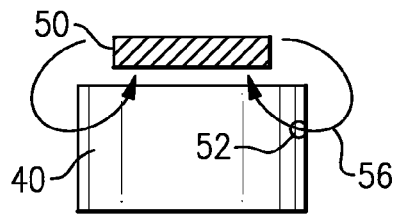
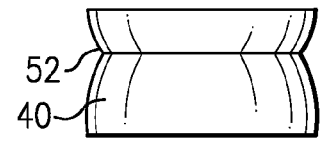
FIG.3A
Prior Art
FIG.3B
Prior Art
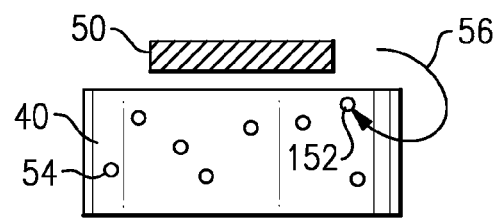
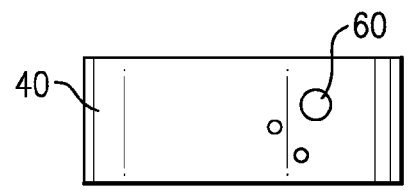
FIG.4A
Prior Art
FIG.4B
Prior Art
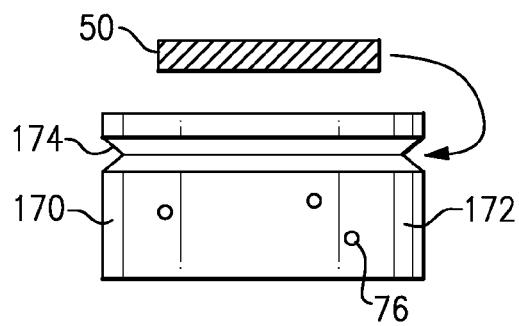
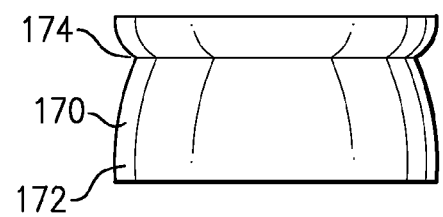
FIG.5A
FIG.5B

PUCK FOR CATHODIC ARC COATING WITH CONTINUOUS GROOVE TO CONTROL ARC

BACKGROUND OF THE INVENTION

This application relates to an electrode puck for use in cathodic arc coating wherein a continuous groove is formed to aid in the manipulation of the movement of the electric arc, and eliminate a tendency to stall in a pore in the puck.

Cathodic arc coating systems are known, and typically include one electrode or cathode formed of coating material. Typically, the puck is the cathode. Electrical connections are made to both the cathode, and typically a chamber surrounding the cathode. The chamber is typically connected to be an anode.

An electrical arc travels around the cathode which causes the evaporation of the cathode material as a vapor cloud at the spots where the arc touches the puck. A magnetic force is induced around the cathode, and this magnetic force aids in steering the arc around the perimeter of the puck, thus, the vapor cloud is formed around the circumference of the surface of the cathode. Parts to be coated are located in the path or throw of this cloud. The magnetic force is rotated to cause the arc to move continuously around the cathode. In this manner, a cloud is formed uniformly about a central axis of the cathode puck, and the parts are evenly coated.

However, in practice, there is one concern wherein the puck may have a porosity that causes the arc to stall within a pore and the magnetic field which helps steer the arc cannot overcome the geometrical constraints encountered by such porosity. That is, the arc will not continue to rotate uniformly about the puck and thus the vapor cloud will not be formed uniformly within the chamber. When this occurs, the coating deposited onto the parts is not uniform.

SUMMARY OF THE INVENTION

In a disclosed embodiment of this invention, a cathode puck is formed with a continuous depression such that the likelihood that the arc will stall in any pore is greatly reduced as it will be preferably guided through the geometrically favorable depression providing more uniform movement of the arc and subsequent formation of the vapor cloud.

These and other features of the present invention can be best understood from the following specification and drawings, the following of which is a brief description.

BRIEF DESCRIPTION OF THE DRAWINGS

FIG. 3A shows the ideal operation of the prior art puck.
FIG. 3B shows the prior art puck after the ideal operation.
FIG. 4A shows a problem in the prior art.
FIG. 4B shows the shape of the prior art puck if this problem occurs.
FIG. 5A shows the operation of an inventive puck.
FIG. 5B shows the shape of the inventive puck after the beginning of coating operations.

DETAILED DESCRIPTION OF THE PREFERRED EMBODIMENT

Figure 1:
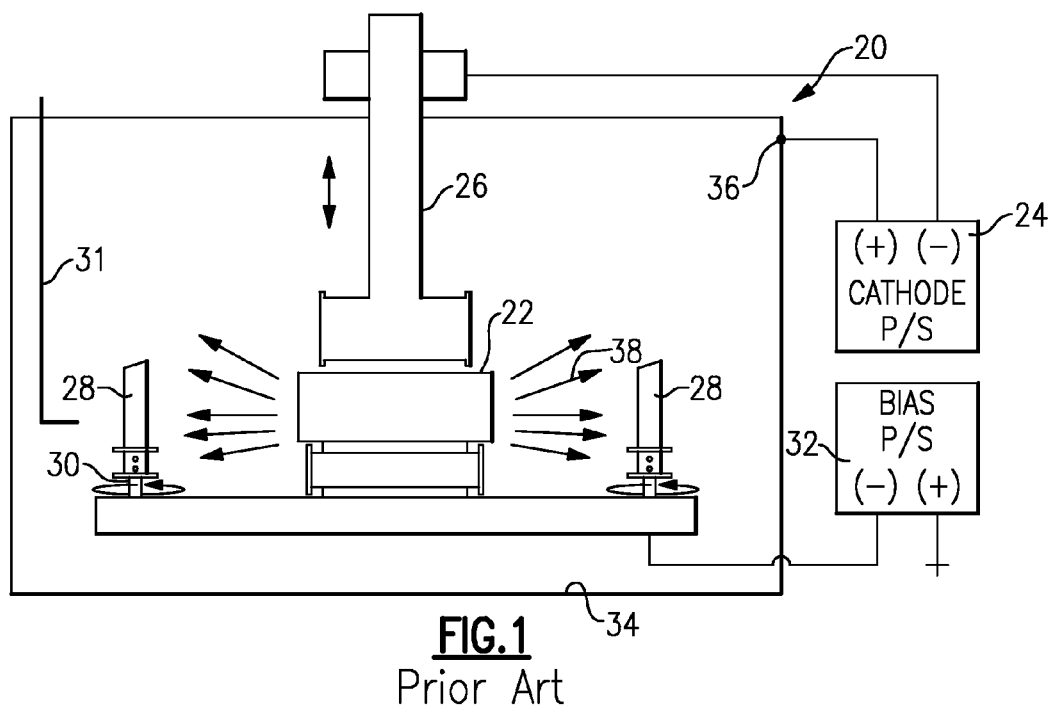
FIG. 1 is a schematic view of a cathodic arc coating system.

A cathodic arc coating system 20 is schematically illustrated in FIG. 1. A puck 22 is formed of a material to be consumed to provide a coating on parts 28 which are located within a housing 34. A so-called stinger 26 communicates electrical energy to the puck 22. The stinger carries rotating magnets as known. The parts to be coated 28 rotate along a drive axis 30, as known in the prior art. Turbine blades are but one example of parts coated in this manner. A trigger arm 31 is also shown.

A biased power supply 32 and a cathode power supply 24 are connected to the chamber housing 34 and the stinger 26. As known, with operation of prior art systems, a rotating magnetic field moves uniformly and steers the electrical arc around the puck 22. A positively charged vapor cloud 38 is formed which moves outwardly, resulting in coating of the negatively biased parts 28. As the coating occurs, the puck 22 is consumed.

Figure 2:
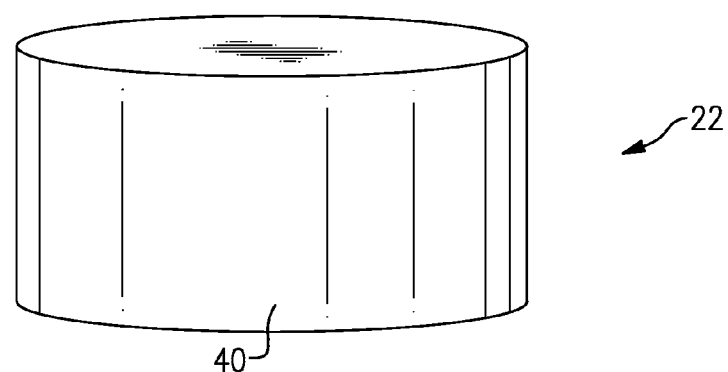
FIG. 2 shows a prior art puck.

FIG. 2 shows the prior art puck 22 having a generally cylindrical outer surface 40.

FIG. 3A shows the ideal operation of this prior art system. As shown, the outer periphery of the puck 40 has a point 52 where the electric arc is initially struck by a trigger and is subsequently steered around the outer periphery of the puck 40 by the magnetic field 56 induced by the magnets 50. As the magnets continue to rotate, the arc, and hence the contact point 52, should move uniformly circumferentially around the outer periphery of the puck 40. Thus, as shown in FIG. 3B, with some use, the puck 22 could have a locus of arc-struck points around the perimeter of the puck resulting in a depression 52 which is generally uniform around this outer periphery. If the wear on the puck is uniform, then the volume of the cloud should be uniform, and the parts 28 should be uniformly coated.

A problem with the prior art is illustrated in FIG. 4A. As shown in FIG. 4A, there is often a porous condition at the outer periphery of the puck 40. Thus, pores 152 and 54 are shown in FIG. 4A. The rotating arc may become trapped in any one of these pores and will not rotate smoothly around the puck. When this occurs, the coating vapor cloud will not be uniform, and the parts will not be uniformly coated. As shown, for example in FIG. 4B, the pore from FIG. 4A has now grown to be quite large as shown at 60. This is due to the arc having been trapped in the original pore.

FIG. 5A shows an inventive puck 170 having cylindrical outer surface 172, and a groove 174. The groove 174 will allow the arc to avoid any pores. The problematic porosity tends to be at the outer periphery of the puck 170, and thus the positioning of the groove 174 at the outer periphery will cause the arc to move uniformly, and will avoid it being stuck in any of these surface pores 76 (see FIG. 5A). FIG. 5A shows a puck 170 wherein the groove 174 is not at the top, but spaced slightly downwardly. Stated another way, the groove 174 is clearly closer to the top of the puck 170 than to a bottom.

As shown in FIG. 5B, after some use, the puck 170 will have a deeper groove 174, and will resemble the groove of FIG. 3B. Once the arc has rotated about the puck evenly for some time, the temperature of the puck increases, generally to a red hot condition. This will help close up the remaining pores, decreasing the likelihood of the arc becoming trapped outside of the groove.

In summary, the present invention provides a continuous depression in an outer periphery of a puck to ensure the arc will move continuously and uniformly during the initial use of the puck during the coating process. This provides a favorable path for the arc to travel around the periphery of the puck during the beginning of the coating process, as the circumferential groove would in most cases be deeper than the porosity encountered in the outer surface of the cathode. While disclosed as the cathode, the puck can also provide the anode.

Although an embodiment of this invention has been disclosed, a worker of ordinary skill in this art would recognize that certain modifications would come within the scope of this invention. For that reason, the following claims should be studied to determine the true scope and content of this invention.

What is claimed is:

1. A method of providing cathodic arc coating of a plurality of parts comprising the steps of:

providing a housing, and an electrode within the housing, and electrical connections to both said electrode and said housing;

locating parts to be coated about an axis of said electrode;

providing a puck formed of a coating material, creating an arc about the puck, said puck having a generally cylindrical depression to assist the arc moving uniformly about an outer periphery of the puck, said depression being formed closer to one end of the puck body than a second end, said depression already being on the puck when the puck is initially placed in the housing; and consuming the puck to coat the parts.

2. The method as set forth in claim 1, wherein said depression is formed adjacent one end of the puck.

3. The method as set forth in claim 1, wherein the puck and electrode provide a cathode.

\* \* \* \* \*